United States Patent
Higashi et al.

(10) Patent No.: US 6,342,444 B1
(45) Date of Patent: Jan. 29, 2002

(54) METHOD OF FORMING DIFFUSION BARRIER FOR COPPER INTERCONNECTS

(75) Inventors: Kazuyuki Higashi, Yokohama; Noriaki Matsunaga, Chigasaki; Hiroshi Toyoda; Akihiro Kajita, both of Yokohoma; Tetsuo Matsuda, Tano-gun; Hisashi Kaneko, Fujisawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,595

(22) Filed: Mar. 10, 2000

(30) Foreign Application Priority Data

Mar. 11, 1999 (JP) ............................................. 11-064593

(51) Int. Cl.[7] ......................................... H01L 21/4763
(52) U.S. Cl. ....................... 438/627; 438/630; 438/635; 438/643; 438/653; 438/660; 438/687
(58) Field of Search ................................ 438/618, 627, 438/635, 643, 653, 658, 660, 687, 688, 630

(56) References Cited

U.S. PATENT DOCUMENTS

| 5,470,789 | A | | 11/1995 | Misawa | 438/643 |
| 6,100,195 | A | * | 8/2000 | Chan et al. | 538/687 |
| 6,150,270 | A | * | 11/2000 | Matsuda et al. | 438/687 |
| 6,171,960 | B1 | * | 1/2001 | Lee | 438/687 |
| 6,204,179 | B1 | * | 3/2001 | McTeer | 438/687 |

OTHER PUBLICATIONS

Metal Handbook, p. 24, "Glossary of Terms and Engineering Data", ASM International, 1998.*

* cited by examiner

*Primary Examiner*—Charles D. Bowers Jr.
*Assistant Examiner*—Asok Kumar Sarkar
(74) *Attorney, Agent, or Firm*—Finnegan, Henderson, Farabow, Garrett, & Dunner, L.L.P.

(57) ABSTRACT

A TiN film is selectively formed as a barrier layer on a Cu metal layer by selective removal of a Ti metal layer on the Si metal layer after the following steps of selectively forming a Si metal layer as an etching mask on an insulation film, forming a trench pattern by selective removal of the insulation film using the Si metal layer, forming a Cu metal layer in the trench pattern with the Si metal layer remained, forming the Ti metal layer on the Si metal layer and the Cu metal layer as a barrier material with a different kind of eutectic reaction with Cu from the reaction with the etching mask by heat-treatment in an atmosphere of nitrogen, and selectively nitriding the Ti metal layer on the Cu metal layer by heat-treatment of the Ti metal layer in an atmosphere of nitrogen.

18 Claims, 3 Drawing Sheets

METHOD OF FORMING DIFFUSION BARRIER FOR COPPER INTERCONNECTS

CROSS-REFERENCE TO RELATED APPLICATION

This application is based upon and claims the benefit of priority from the prior Japanese Patent Application No. 11-064593, filed Mar. 11, 1999, the entire contents of which are incorporated herein by reference.

BACKGROUND OF THE INVENTION

The present invention relates to a manufacturing method of a semiconductor device, and, particularly to improvements in the oxidation resistance and a property as diffusion barrier of formed Cu wiring.

Along with the development of finer miniaturization and more large-scaled integration of semiconductor devices, more miniaturized and multilayered metal wiring has been developed. Al alloy has been used as a miniaturized metal wiring material so far. However, when Al alloy is used, there has been a problem that the wiring resistance is increased, and the electro-migration resistance is degraded. Recently, Cu has been paid attention as a multi-layered wiring material.

However, wiring using Cu is easily oxidized in an oxidizing atmosphere such as deposition of interlayer insulation films, and separation of resists. Cu is diffused into interlayer insulation films unless the wiring surface is covered with suitable barrier metal. The diffusion of Cu into the interlayer insulation films causes degradation of the characteristics of MOS elements, as Cu becomes a life time killer of Si devices.

Then, when wiring using Cu is put to practical use, a method of covering the wiring surface with a protection film has been proposed to prevent the diffusion and the oxidation of Cu. A method of forming p-SiN on the wiring surface and the whole surface of insulation films, or a method of selectively forming a barrier layer only on the upper wiring surface has occurred to us for a method of covering the Cu wiring surface.

However, the relative dielectric constant of p-SiN used for surface covering is large (about 7). And, it covers not only the upper wiring surface, but also the whole surface of the insulation films. Therefore, even with a material having a low dielectric constant for interlayer insulation films, it is impossible to reduce the capacitance of highly pitched wiring.

On the other hand, when a barrier layer is selectively formed only on Cu, there are problems such as not enough barrier property and uniformity of the formed barrier layer. Especially, the barrier property is reduced when the barrier layer is formed away from the wiring surface. And, there is conceived of a method for a process selectively to form a barrier layer only on Cu as described in the following: A barrier material such as Al is formed on a Cu wiring, and a reaction layer is formed by thermal processing. Then, Al, other than that on the Cu wiring, is etched with substances such as acid, and alumina is formed on the Cu wiring surface as a diffusion barrier by heat-treatment. However, the above method has had a problem that, when the reacted Al film is thick, enough acid resistance is obtained, but, Al is also diffused into the Cu wiring to increase the resistance. Moreover, when the reaction Al film is thin to prevent increasing the resistance, there has been a problem that the acid resistance is not enough, and the etching selectivity to etch the parts other than those on the wiring was not obtained.

As mentioned above, in conventional manufacturing methods of a semiconductor device, a method of forming p-SiN on the wiring surface, or a method of selectively forming a barrier layer on the wiring surface has occurred to us for covering the Cu wiring upper surface. However, there have been problems such as the increased wiring capacitance, and not enough barrier property and uniformity of the formed barrier layer.

BRIEF SUMMARY OF THE INVENTION

The object of the present invention is to provide a manufacturing method of a semiconductor device having the reduced wiring capacitance and wiring resistance, and the good barrier and uniformity properties.

According to a first aspect of the present invention, the present invention provides a manufacturing method of a semiconductor device comprising the steps of: forming an insulation film on a substrate; selectively forming an etching mask on the insulation film; forming a trench by selective removal of the insulation film using the etching mask; forming a Cu wiring in the trench with at least some parts of the etching mask remained; forming a barrier material on the etching mask and the Cu wiring; having an eutectic reaction between the etching mask and the barrier material by heat-treatment of the barrier material in an atmosphere of nitrogen, and nitriding the barrier material on the Cu wiring to form a barrier layer against Cu diffusion and oxidation; and removing the barrier material selectively on the etching mask after eutectic reaction with the etching mask, and making the barrier layer remained selectively on the Cu wiring.

According to another aspect of the present invention, the present invention provides a manufacturing method of a semiconductor device comprising the steps of: forming an insulation film on a substrate; selectively forming an etching mask on the insulation film; forming a trench by selective removal of the insulation film using the etching mask; forming a Cu wiring in the trench with at least some parts of the etching mask remained; forming a barrier material on the etching mask and the Cu wiring; having an eutectic reaction between the etching mask and the barrier material by heat-treatment of the barrier material; removing the barrier material selectively on the etching mask after eutectic reaction with the etching mask, and making the barrier material remained selectively on the Cu wiring; and nitriding the barrier material remained, thereby to form a barrier layer selectively on the Cu wiring.

According to a still another aspect of the present invention, the present invention provides a manufacturing method of a semiconductor device comprising the steps of: forming an insulation film on a substrate; forming a trench by selective removal of the insulation film; forming a Cu wiring in the trench; forming, on the Cu wiring and the insulation film, a barrier material having higher binding energy with oxygen, and better oxidation resistance than that of Cu and better property as Cu diffusion than that of Cu; forming an alloy layer of Cu and the barrier material on the Cu wiring by heat-treatment of the barrier material; selectively removing the barrier material, other than that on the Cu wiring with acid treatment containing the barrier material; and forming a barrier layer by selective oxidation of the alloy layer through heat-treatment of the alloy layer remained on the Cu wiring in an atmosphere where Cu is deoxidized, and the barrier material is oxidized.

In the present invention, an etching mask used for forming a trench is made to remain at forming a Cu wiring; a Cu wiring is formed in the trench; a barrier material having different kinds of eutectic reactions by heat-treatment is formed on the Cu wiring and the etching mask; the barrier material on the Cu is selectively nitrided, or oxidized, using the difference reactions between the eutectic reaction with the Cu wiring and that with the etching mask by heat-treatment of the barrier material in an atmosphere of oxygen or nitrogen. Therefore, it is possible to reduce the wiring capacitance in comparison with the conventional case where the barrier material is formed not only on the Cu wiring, but also on the whole surface of the insulation film.

In another aspect of the present invention, the barrier material is formed in a self-aligning manner to form a barrier layer with good barrier property; it is easy selectively to eliminate the barrier material other than that on the Cu wiring with less dishing and the like. Therefore, it is possible to form the barrier layer with good uniformity and reduced wiring resistance.

In still another aspect of the present invention, a Cu wiring is formed; a barrier material having higher binding energy with oxygen, and better oxidation resistance and Cu diffusion barrier property than those of Cu is formed; an alloy layer is formed on the Cu wiring by heat-treatment; the barrier material, other than that on the Cu wiring, is selectively eliminated with acid treatment containing the barrier material, that is, for selective removal of the barrier material, acid having the barrier material is used for the processing as mentioned above. Thereby, the barrier layer may be formed in a self-aligning manner, and the etching selectivity to etch the parts other than those on the Cu wiring may be improved. The presence of the barrier material contained in the acid causes the difference in the electrode potential between the reaction layer and the non-reaction layer to improve the etching selectivity. Therefore, there is no need to secure the etching selectivity by thickening the barrier material, that is, only thin barrier layer may be required. Moreover, while securing the etching selectivity to etch the parts other than those on the Cu wiring layer, it may be possible to reduce diffusion of the barrier material, prevent increase in the resistance, and maintain the high barrier property as a result of secured etching selectivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below, referring to drawings.

(FIRST EMBODIMENT)

FIGS. 1A to 1G show sectional views of steps of a manufacturing method of a semiconductor device according to a first embodiment of the present invention.

Figure 1A:
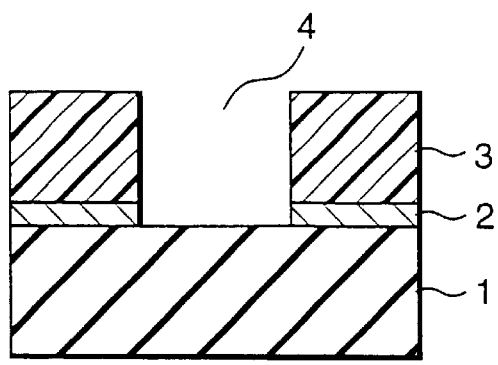
FIGS. 1A to 1G show sectional views of steps of a manufacturing method of a semiconductor device according to a first embodiment of the present invention.

At first, a Si metal layer 2 is formed as an etching mask on an insulation film 1 by the sputtering method or the like, as shown in FIG. 1A. Then, a resist 3 is applied on the Si metal layer 2, patterning of the resist 3 is performed by exposing to light to form a resist pattern. A trench pattern 4 is made on the Si metal layer 2 by a method such as the reactive ion etching (RIE) method, using the resist pattern as a mask. Thereafter, the resist 3 is eliminated by the ashing method or the like. Then, an insulation film 1 is etched by the RIE method or the like under less removal of the Si metal layer 2, as shown in FIG. 1B.

Figure 1E:
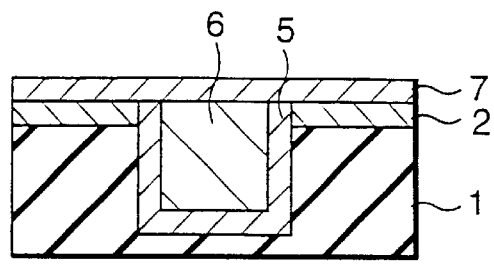
Figure 1B:
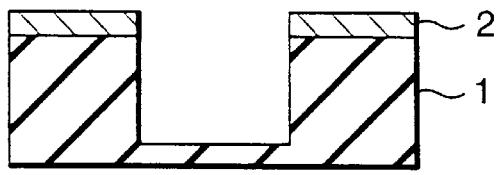
Figure 1F:
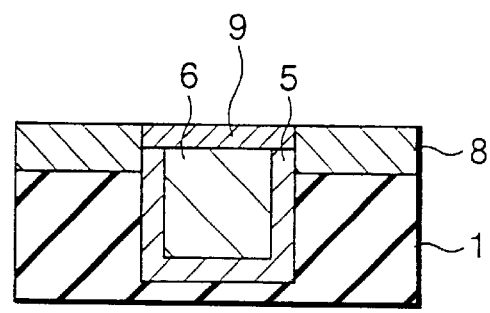
Figure 1C:
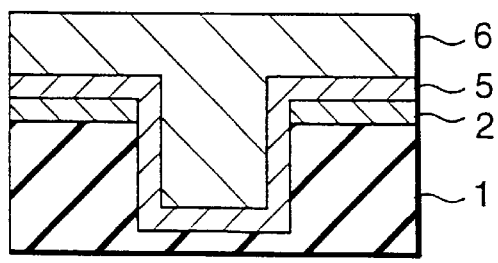
Figure 1G:
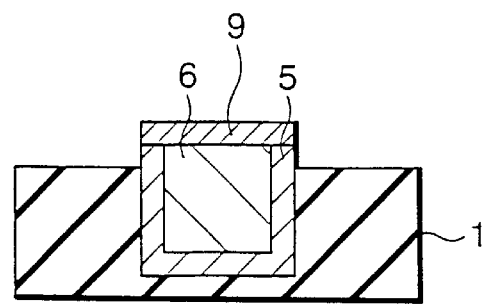
Figure 1D:
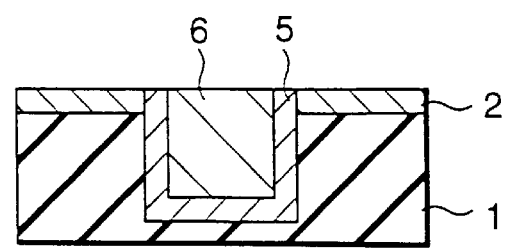

Next, after a TiN metal layer 5 is formed as a liner member by the sputtering method or the CVD method as shown in FIG. 1C, a Cu metal layer 6 is deposited on the layer by a method such as the sputtering method, the CVD method or the plating method. Thereafter, Cu and TiN other than those in the trench, are eliminated by a method such as the Chemical Mechanical Polishing (CMP) method, as shown in FIG. 1D.

Next, a Ti metal layer 7 is deposited on the surface of the Si metal layer 2 and the Cu metal layer 6 by the sputtering method or the like, as shown in FIG. 1E. Ti shows a different kind of eutectic reaction with the Si metal layer 2 from the reaction with the Cu metal layer 6 by heat-treatment in an atmosphere of oxygen or nitrogen. Accordingly, Ti is heat-treated in an atmosphere of nitrogen after deposition of the Ti metal layer 7 to show a different kind of eutectic reaction with the Si metal layer 2 from the reaction with the Cu metal layer 6. Specifically, Ti on the Si metal layer 2 causes alloy reaction with Si there to form a TiSi alloy layer 8, and Ti on the Cu metal layer 6 is nitrided to form a TiN film 9 effective for non-diffusion of Cu, as shown in FIG. 1F. Finally, the TiSi alloy layer 8 is selectively eliminated by a method such as the CDE (Chemical Downflow Etching) method, as shown in FIG. 1G. Thereby, the TiN film 9 may be formed only on the Cu metal layer 6 as a non-diffusion layer of Cu in a self-aligning manner.

Moreover, substances such as TaN, WN, and WSi may be used for the TiN metal layer 5 as a liner member of Cu. Substances with a difficult diffusion into Cu, and an easy eutectic reaction with the Si metal layer 2 by heat-treatment, for example, Zr, Be, Cr, Mg, Ta, Nb, Ti, V, Sn, W, and Co, may be preferably used for the TiN metal layer 7.

Thus, in this embodiment, the wiring capacitance may be reduced in comparison with that of conventional cases wherein a barrier layer is formed not only on the Cu metal layer, but also on the whole surface of the insulation film, as the TiN film 9 which is a barrier layer, is selectively formed only on the Cu metal layer 6. Moreover, the TiN film 9 is formed in a self-aligning manner to form a barrier layer with the good barrier property, and it is easy selectively to eliminate barrier materials, other than those on the Cu metal layer 6, with less dishing. That is, it may be possible to form the TiN film 9 with good uniformity and not-reduced wiring resistance.

(SECOND EMBODIMENT)

Figure 2F:
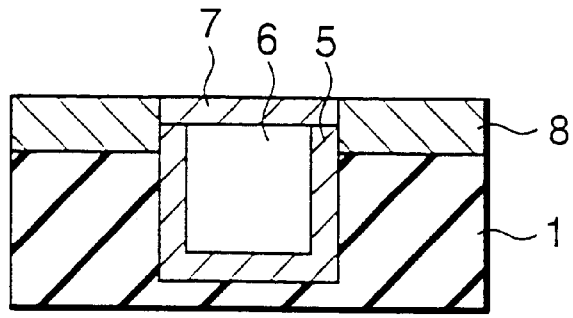
FIGS. 2F to 2H show sectional views of steps of a manufacturing method of a semiconductor device according to a second embodiment of the present invention.
Figure 2G:
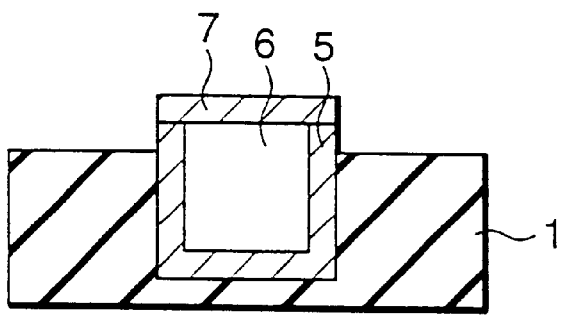
Figure 2H:
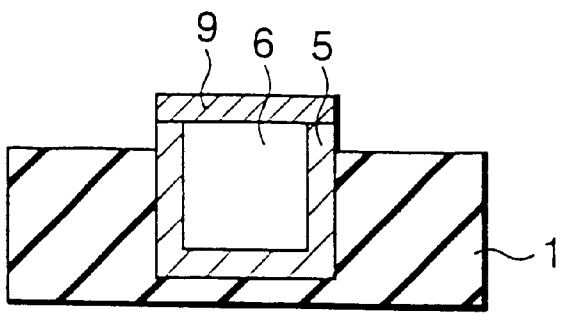

FIGS. 2F to 2H show sectional views of steps of a manufacturing method of a semiconductor device according to a second embodiment of the present invention. In a manufacturing method according to this embodiment, parts similar to those in the first embodiment are denoted by the same reference numbers, and common drawings and detailed description will be omitted.

In this embodiment, the steps shown in FIGS. 1A to 1E of the first embodiment are processed similarly as the first embodiment. Then, Ti on the Si metal layer causes an alloy reaction with Si to form a TiSi alloy layer 8, and Ti on the Cu metal layer remains unchanged by heat-treatment in a vacuum, as shown in FIG. 2F. Thereafter, the Ti metal layer 7 may be remained only on the Cu metal layer 6 by removing the TiSi alloy layer 8 with a method such as the CDE method, as shown in FIG. 2G. And a TiN film 9 effective for a non-diffusion layer of Cu is formed by heat-treatment in an atmosphere of nitrogen, as shown in FIG. 2H. It may be also possible to form a TiO film by heat-treatment in an atmosphere of oxygen.

Thereby, according to this embodiment, the same effects as the first embodiment may be obtained, and it may be possible to form a barrier layer with further higher etching selectivity than that of the first embodiment. Moreover, substances such as TaN and WN may be used for the TiN metal layer 5 as a liner member of Cu. Substances with a difficult diffusion into Cu, and an easy eutectic reaction with the Si metal layer 2 by heat-treatment, for example, Al and Zr, may be preferably used for the TiN metal layer 7.

(THIRD EMBODIMENT)

FIGS. 3A to 3E show sectional views at steps of a manufacturing method of a semiconductor device according to a third embodiment of the present invention.

Figure 3A:
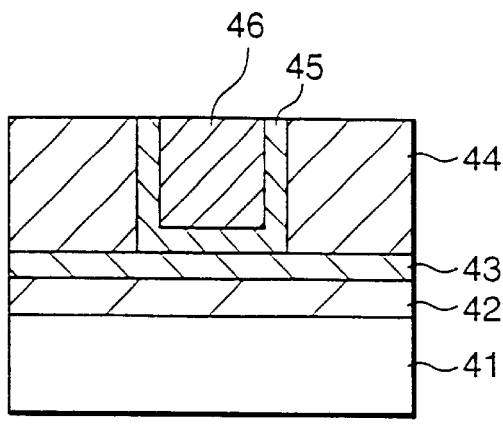
FIGS. 3A to 3E show sectional views of steps of a manufacturing method of a semiconductor device according to a third embodiment of the present invention.

At first, thermal oxidation film 42 is formed to have a thickness of 100 nm on a Si substrate 41, as shown in FIG. 3A. Then a p-SiN film 43 is deposited to have a thickness of 30 nm thereon, and further, a CVD oxidation film 44 is deposited to have a thickness of 400 nm thereon. Thereafter, a wiring pattern trench with a depth of 400 nm is formed in an insulation film 44 by the usual PEP (Photo Engraving Process) and oxidation film etching. In the pattern, the wiring with L/S=0.4/0.4 μm, having a length of 1.5 mm, is connected to an electrode pad. A TaN film 45 with a thickness of 20 nm and a Cu metal layer 46 with a thickness of 800 nm (both are not shown) are deposited on the wiring pattern trench by the sputtering method. And, the Cu metal layer 46 is embedded in the trench by heat-treatment in a vacuum at 450° C. After that, the CMP processing is performed to form the Cu wiring.

Figure 3B:
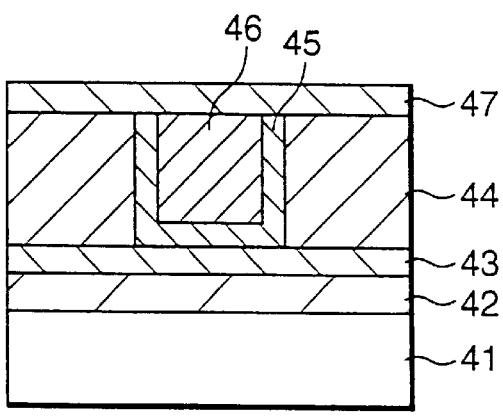

Next, an Al film 47 is formed to have a thickness of 5 nm on the whole surface of the Cu metal layer 46, and a CVD oxidation film 44 as a barrier material by the sputtering method, as shown in FIG. 3B. Al serving as a barrier material has higher binding energy with oxygen than that of Cu, and better oxidation resistance and better property as Cu diffusion barrier.

Figure 3C:
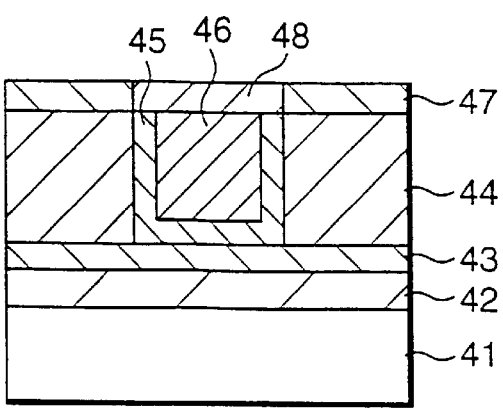
Figure 3D:
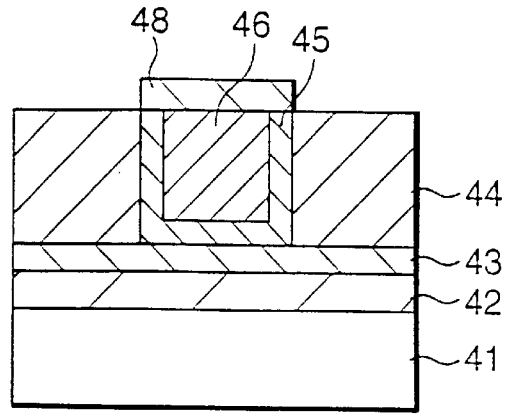

Then, the Al film 47 is heat-treated in the atmosphere at 150° C. for one hour. By the heat-treatment, the Al film 47 on the Cu metal layer 46 is changed to a CuAlx layer 48, as shown in FIG. 3C. Then, in order to eliminate the Al film 47 other than that on the Cu metal layer 46, the semiconductor device is immersed in concentrated phosphoric acid, as shown in FIG. 3D. In the acid, Al used as a barrier material is dissolved beforehand to have 0.1 mol/l of Al ions.

Other than the above method wherein the Al film is dissolved beforehand, there may be methods such as a process wherein excessive Al film may be etched for having Al ions in the acid with the same effects as those of the above method. Thus, the Al ions dissolved cause the difference of electrode potential between the CuAlx layer 48 of a reaction layer and the Al film 47 of a non-reaction layer to improve the etching selectivity. Therefore, the Al film 47 other than that on the Cu metal layer 46 may be completely eliminated without damaging the CuAlx layer 48 on the Cu metal layer 46.

Figure 3E:
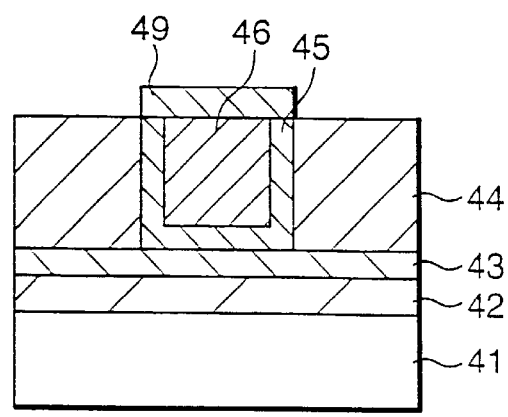

Thereafter, annealing of the device is performed at 450° C. for two hours in a mixed atmosphere of nitrogen and hydrogen. Thereby, the Al in the CuAlx layer 48 is selectively oxidized to form an AlOx layer 49 on the surface of the Cu metal layer 46, as shown in FIG. 3E. The same effects may be obtained in an atmosphere of oxygen-free such as pure nitrogen and pure argon obtains, even without hydrogen in the atmosphere.

On the other hand, when the concentrated phosphoric acid was used without containing the Al ions, oven tests after annealing in a mixed atmosphere of nitrogen and hydrogen showed an increase in the resistance by 20%. This is because the AlOx layer as an anti-oxidation layer had not fully been formed, as the CuAlx layer on the Cu wiring was also etched.

And, the thick CuAlx layer 48 may be formed by making the Al film 47 thick to improve the acid resistance. But, the excessive quantity of Al is diffused into the Cu wiring to have not enough selective oxidation even under annealing in the mixed atmosphere of nitrogen and hydrogen, and increase the resistance of the Cu wiring. Therefore, it is preferably to make the Al film 47 thin within a range to secure the etching selectively.

As mentioned above, the Al film 47 of a barrier material is selectively eliminated using acid containing Al as a barrier material, according to the present embodiment. Thereby, the barrier layer may be formed on the Cu wiring in a self-aligning manner with the improved etching selectivity, wherein the parts other than those on the Cu metal layer are selectively etched. Therefore, there is no need to secure the etching selectively by thickening the barrier material, that is, only thin barrier material may be required. Moreover, while securing the etching selectivity to etch the parts other than those on the Cu wiring layer, it may be possible to reduce diffusion of the barrier material, prevent increase in the resistance, and maintain the high barrier property.

As mentioned above, the Al film 47 of a barrier material is selectively eliminated using acid containing Al as a barrier material, according to the present embodiment. Thereby, the barrier layer may be formed on the Cu wiring in a self-aligning manner with the improved etching selectivity, wherein the parts other than those on the Cu metal layer are selectively etched. Therefore, there is no need to secure the etching selectivity by thickening the barrier material, that is, only thin barrier material may be required. Moreover, while securing the etching selectivity to etch the parts other than those on the Cu wiring layer, it may be possible to reduce diffusion of the barrier material, prevent increase in the resistance, and maintain the high barrier property.

As the details are described above, according to the present invention, a barrier layer may be selectively formed only on a Cu wiring layer by heat-treatment in an atmosphere of oxygen or nitrogen with an etching mask remained. Therefore, it may be possible to reduce the wiring capacitance, form a barrier layer with good barrier and uniform properties, and prevent the increase in the wiring resistance.

Moreover, according to another characteristic of the present invention, it may be possible to improve the etching selectivity of a barrier material with acid treatment containing the barrier material. Thereby, it may be possible to reduce the wiring capacitance, reduce diffusion of the barrier material, and prevent the increase in the wiring resistance, while securing the etching selectivity to etch the parts other than those on the Cu wiring layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a diffusion barrier for copper interconnects comprising the steps of:

forming an insulation film on a substrate;

selectively forming an etching mask on the insulation film;

forming a trench by selective removal of the insulation film using the etching mask;

forming a Cu wiring in the trench with at least some parts of the etching mask remaining;

forming a barrier material on the etching mask and the Cu wiring;

forming a metal nitride by reacting between the etching mask and the barrier material on the Cu wiring by heat-treatment of the barrier material in an atmosphere of nitrogen, and nitriding the barrier material on the Cu wiring to form a diffusion barrier layer against Cu diffusion and oxidation; and removing the barrier material selectively on the etching mask after nitriding the barrier material, and making the diffusion barrier layer remained selectively on the Cu wiring.

2. The method of claim 1, wherein the etching mask has a structure where a first film, and a second film comprising a resist are laminated one after another to cause the reaction between the first film and the barrier material.

3. The method of claim 1, wherein the etching mask has a structure where a first film, and a second film comprising a resist are laminated one after another, and the method further has a step of removing the second film after forming the trench.

4. The method of claim 1, wherein the barrier material is at least one of Ti, Al, and Zr.

5. A method of forming a diffusion barrier for copper interconnects comprising the steps of:

forming an insulation film on a substrate;

selectively forming an etching mask on the insulation film;

forming a trench by selective removal of the insulation film using the etching mask;

forming a Cu wiring in the trench with at least some parts of the etching mask remaining;

forming a barrier material on the etching mask and the Cu wiring;

forming a first layer by reacting between the etching mask and the barrier material on the Cu wiring by heat-treatment of the barrier material in an atmosphere of oxygen, and oxidizing the first layer on the Cu wiring; and removing the barrier material selectively on the etching mask after oxidizing the first layer with the etching mask, and making the first layer remained selectively on the Cu wiring as a diffusion barrier layer against Cu diffusion and oxidation.

6. A manufacturing method of a semiconductor device according to claim 5, wherein the etching mask has a structure where a first film, and a second film comprising a resist are laminated one after another to cause the reaction between the first film and the barrier material.

7. The method of claim 5, wherein the etching mask has a structure where a first film, and a second film comprising a resist are laminated one after another, and the method further has a step of removing the second film after forming the trench.

8. The method of claim 5, wherein the barrier material is at least one of Ti, Al, and Zr.

9. A method of forming a diffusion barrier for copper interconnects comprising the steps of:

forming an insulation film on a substrate;

selectively forming an etching mask on the insulation film;

forming a trench by selective removal of the insulation film using the etching mask;

forming a Cu wiring in the trench with at least some parts of the etching mask remaining;

forming a barrier material on the etching mask and the Cu wiring;

forming a first layer by reacting between the etching mask and the barrier material on the Cu wiring by heat-treatment of the barrier material;

removing the barrier material selectively on the etching mask after the reaction with the etching mask, and making the first layer remained selectively on the Cu wiring; and nitriding the first layer selectively on the Cu wiring to form a diffusion barrier layer.

10. A manufacturing method of a semiconductor device according to claim 9, wherein the etching mask has a structure where a first film, and a second film comprising a resist are laminated one after another to cause the reaction between the first film and the barrier material.

11. The method of claim 9, wherein the etching mask has a structure where a first film, and a second film comprising a resist are laminated one after another, and the method further has a step of removing the second film after forming the trench.

12. The method of claim 9, wherein the barrier material is at least one of Ti, Al, and Zr.

13. A method of forming a diffusion barrier for copper interconnects comprising the steps of:

forming an insulation film on a substrate;

selectively forming an etching mask on the insulation film;

forming a trench by selective removal of the insulation film using the etching mask;

forming a Cu wiring in the trench with at least some parts of the etching mask remaining;

forming a barrier material on the etching mask and the Cu wiring;

forming the first layer by reacting between the etching mask and the barrier material on the Cu wiring by heat-treatment of the barrier material;

removing the barrier material selectively on the etching mask after the reaction with the etching mask, and making the first layer remained selectively on the Cu wiring; and oxidizing the first layer remained, and making the first layer remained selectively on the Cu wiring as a diffusion barrier layer.

14. A manufacturing method of a semiconductor device according to claim 13, wherein the etching mask has a structure where a first film, and a second film comprising a resist are laminated one after another to cause the reaction between the first film and the barrier material.

15. The method of claim 13, wherein the etching mask has a structure where a first film, and a second film comprising a resist are laminated one after another, and the method further has a step of removing the second film after forming the trench.

16. The method of claim 13, wherein the barrier material is at least one of Ti, Al, and Zr.

17. A method of forming a diffusion barrier for copper interconnects comprising the steps of:

forming an insulation film on a substrate;

forming a trench by selective removal of the insulation film;

forming a Cu wiring in the trench;

forming, on the Cu wiring and the insulation film, a barrier material having higher binding energy with oxygen than that of Cu, and having higher resistance toward Cu diffusion;

forming an alloy layer of Cu and the barrier material on the Cu wiring by heat-treatment of the barrier material;

selectively removing the barrier material by acid treatment with the alloy layer on the Cu wiring remaining; and forming a diffusion barrier layer by selective oxidation of the alloy layer through heat-treatment of the alloy layer remaining on the Cu wiring in an atmosphere where Cu is deoxidized, and the barrier material is oxidized.

18. The method of claim 17, wherein the barrier material is Al.

* * * * *